(12) United States Patent
Corella et al.

(10) Patent No.: US 8,743,347 B1
(45) Date of Patent: Jun. 3, 2014

(54) SEMICONDUCTOR IR LAMP REPLACEMENT PROVIDING BANDS IV, II AND BAND I FOR STARING INFRARED COUNTERMEASURES SYSTEM

(75) Inventors: Armando Corella, Azusa, CA (US); Paul Phan, Arcadia, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1135 days.

(21) Appl. No.: 12/712,434

(22) Filed: Feb. 25, 2010

Related U.S. Application Data

(60) Provisional application No. 61/156,117, filed on Feb. 27, 2009.

(51) Int. Cl.
*G01C 3/08* (2006.01)

(52) U.S. Cl.
USPC ........... 356/4.01; 356/3.01; 356/3.1; 356/4.1; 356/5.01

(58) Field of Classification Search
USPC ............. 356/3.01–3.15, 4.01–4.1, 5.01–5.15, 356/6–22, 28, 28.5
See application file for complete search history.

(56) References Cited

U.S. PATENT DOCUMENTS

| | | | | |
|---|---|---|---|---|
| 5,742,384 A | * | 4/1998 | Farmer | 356/141.4 |
| 2008/0142734 A1 | * | 6/2008 | Forsyth et al. | 250/492.1 |
| 2008/0273190 A1 | * | 11/2008 | Smith | 356/4.01 |

* cited by examiner

*Primary Examiner* — Luke Ratcliffe
(74) *Attorney, Agent, or Firm* — Daniel J. Long

(57) ABSTRACT

In a staring infrared countermeasures system, wherein the improvement comprises a semiconductor material emitter for providing a specific infrared wavelength to provide protection against an infrared radiation guided missile.

39 Claims, 16 Drawing Sheets

Final Semiconductor IR Lamp

Single Emitter Semiconductor Laser

SIR - Lamp Single Ring Layout

SEMICONDUCTOR IR LAMP REPLACEMENT PROVIDING BANDS IV, II AND BAND I FOR STARING INFRARED COUNTERMEASURES SYSTEM

RELATED APPLICATIONS

This Application claims rights under 35 USC §119(e) from U.S. Application Ser. No. 61/156,117 filed Feb. 27, 2009, the contents of which are incorporated herein by reference.

FIELD OF THE INVENTION

The present invention relates to starring infrared countermeasure (IRCM) systems and more particularly to methods and apparatus for producing infrared (IR) radiation for use in such systems.

BACKGROUND OF THE INVENTION

There is broad recognition of the threat posed by heat (IR energy) seeking missiles to both military and commercial aviation. In the mid 1970's, defensive systems were rapidly developed and deployed to increase military aircraft battlefield survivability. These systems were highly successful in countering IR-missile threats and have proven themselves invaluable to both military and commercial sectors. These older prior art systems are based on a multi-spectral sources filtered to provide desired IR-missile jam wavelengths. The source must provide significant modulated energy emission, to provide appropriate jamming effectiveness. A major benefit of many older systems is that they are always "ON" and continually providing "staring" protection. The source emission can be tailored to the signature of the platform being protected or provide radiated fields of protection dictated by the geometry of the emitter. The "staring" characteristic ordinarily provides "JAM in the TUBE" protection. That is, missiles affected by such prior art staring systems typically can not launch since the missile's guidance system can not 'lock' onto the desired target.

A drawback to some such prior art systems is that they may be specifically designed for protection against what is referred to as Band I IR missile threats. IR missile technology has evolved to include improved jamming rejection and changes in spectral sensitivity (wavelength); this necessitates new methods to oppose the new threats. These newer IR-missiles are referred to as Band IV threats. To address the advanced technology, infrared countermeasures (IRCM) have followed with increasingly complex and sophisticated protection solutions that basically discards the older technologies. Today's advanced IRCM includes integrated missile warning and precision guided laser jamming technology. The latest Directional Infrared Countermeasure (DIRCM) systems direct high intensity modulated IR lasers on the incoming missile's dome, thus jamming the guidance control system. DIRCM systems differ from Staring systems in that they are significantly more complicated than the older staring systems. In addition, DIRCM systems must be cued by an advanced missile warning system prior to attempting to point and jam with sufficient precision and apply Energy on Target (EoT) to defeat the threat in a moving and turbulent environment. These complexities and the addition of many interrelated subsystems (i.e. Missile Warning, Gimbal, Tracking Camera, Cryogenic Coolers, and Lasers etc.) inherently increase life cycle cost and reduce system reliability. Consequently, the bulk of our military force's aircraft fleet is unprotected against advanced IR missiles. Many aircraft in our current military aircraft fleets, however, are still protected with such older staring IRCM systems.

A need, therefore, exists for still better and economic ways to protect aircraft from the more advanced IR guided missile threats being developed.

SUMMARY OF INVENTION

According to the present invention, the benefits of prior art staring systems and the advancement of Semiconductor IR-Source technology are combined to provide a semiconductor infrared lamp (SIR-Lamp) emitting multiple wavelengths and with sufficient power capable of deterring Bands I, II and IV threats. This invention thus provides a semiconductor infrared lamp that provides an upgrade to conventional Staring IRCM systems by providing a platform protection against modern IR-missile threats.

More specifically, the semiconductor infrared lamp is constructed by loading a number of individual light emitting diode lasers around the periphery of a ring or disk, with a number of rings stacked on top of each other around a central cooling pipe or chamber to provide sufficient output for countermeasuring incoming missiles. In one embodiment the 360° protection in a horizontal plane has a vertically restricted staring field of view, whereas by bending the peripheries of rings carrying the diode lasers, the staring field of view can be increased to as much as 160°, and in some cases greater, to provide near spherical coverage. There are two major products this technology has direct application towards: 1) the AN/ALQ-144 countermeasure set and the AN/ALQ-157 infrared countermeasure system.

As a result, replacing the conventional heating rod in the ALQ-144 with a series of laser rings vacuum-sealed in a lamp configuration can provide high intensity infrared radiation with specifically designed wavelengths and with energy levels to afford protection and without mechanically rotating parts. Likewise with the ALQ-157 removing the arc-lamp and replacing it with the semiconductor-IR lamp provides the additional protection. The difference between the two systems is that the ALQ-144 relies on dual spinning "chopper" sleeves to provide a mechanical driven modulated source. The ALQ-157 modulates the lamp by electrically pulsing the lamp with high current. Both have disadvantages overcome by the laser-lamp proposed in this invention.

It is noted that with the ALQ-144 the mechanical spinning devices are not required to modulate the infrared radiation for producing a jam code. Also note that the semiconductor lasers are modulated in one embodiment to provide the required modulated jamming radiation. Additionally, since the semiconductor output can be tailored as to wavelength there is very little unproductive energy since there is no white light to filter. Also, there are no covert filters needed and no moving parts to wear and fail. This coupled with the fact that there is no warm up period as is the case with prior heating rods makes the subject system highly desirable. Likewise, the ALQ-157 existing lamps require pre-heating before modulation occurs. With the pre-heating, the depth of modulation does not fall to zero. However, this phenomenon also is eliminated with the subject semiconductor-IR lamp since the modulation depth is zero.

Since the jam codes are electrically modulated into the output of the lasers, there is considerable freedom as to the shape of the pulses in both the frequency as well the amplitude domain. In addition, Band IV and Band I diodes can be separately modulated for in band jam code efficiency. Finally, the pump laser provides approximately 18% to 26% wall socket to IR emission efficiency as compared to 2%, when utilizing the prior heated tube broadband IR sources or arc-lamps.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
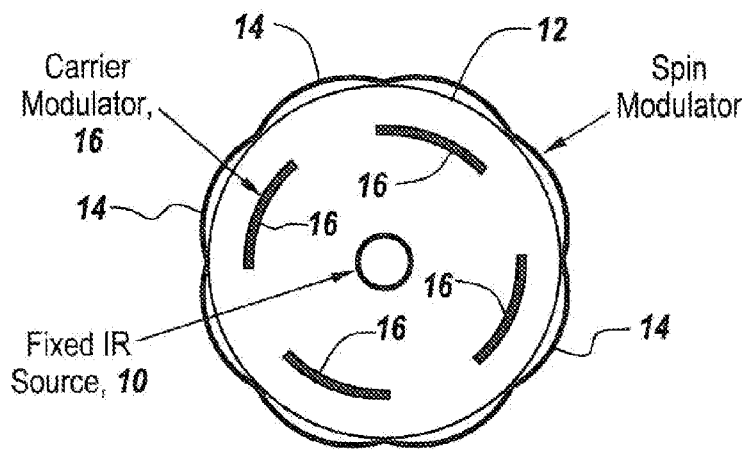
FIG. 1 is a diagrammatic of the ALQ-144 and top view of a prior art IR source that includes a heated tube.

Referring now to FIG. 1, in the past in so-called "hot brick" jamming modules such as the ALQ-144, a fixed IR source 10 in the form of a heating tube is located centrally in a housing 12 that carries lenses 14 about its periphery. Internal to the housing is a carrier modulator 16 in the form of masks which block the output of the fixed IR source.

The laser jamming codes are provided by spinning housing 12 such that the output in any given direction is modulated through the utilization of lenses 14, in much the same way that lighthouses modulate their beams.

Figure 2:
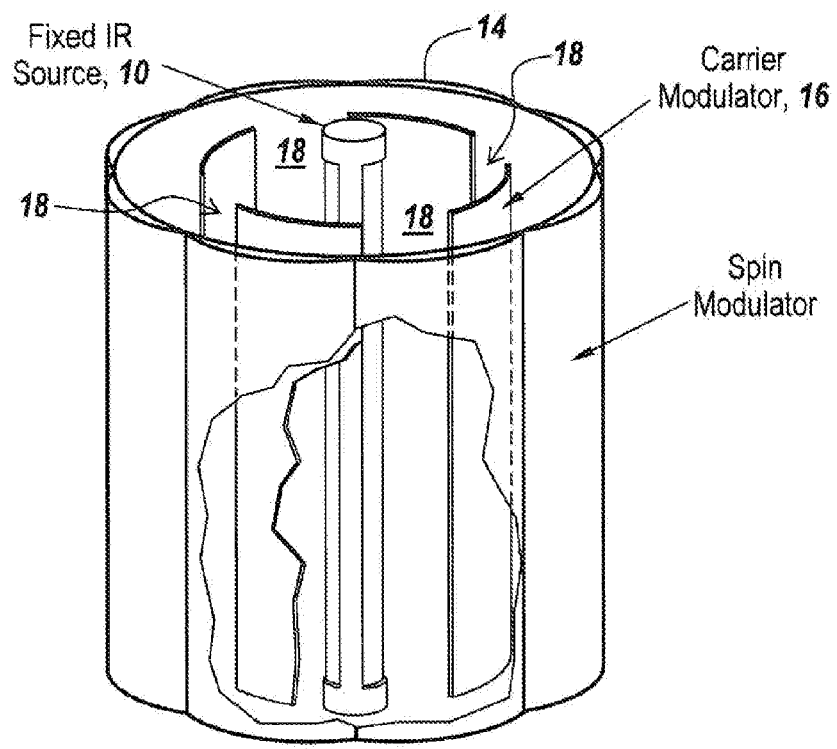
FIG. 2 is a diagrammatic illustration of the assembly of FIG. 1 showing in perspective and cutaway views the fixed IR source and modulating elements surrounding it.

Referring to FIG. 2, it can be seen that fixed IR source 10 is centrally located interior to the spin modulator lenses 14, with the carrier modulator 16 and lenses 14 being disposed around the fixed IR source as illustrated.

The masking provided by the carrier modulator provides that radiation from the fixed IR source only be emitted in the directions illustrated by slots 18 between the carrier modulator masks, with the IR radiation being focused by the lenses to provide the required jamming signals.

As will be appreciated, this configuration requires moving parts, with the output of the fixed IR source in one embodiment being equivalent to white light.

Figure 3:
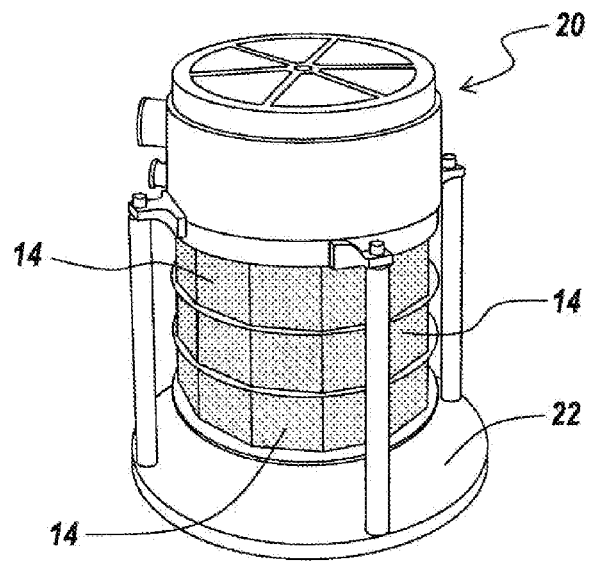
FIG. 3 is a diagrammatic illustration of a staring, always-on infrared, jamming system showing a jamming module composed of the elements of FIGS. 1 and 2.
Figure 4:
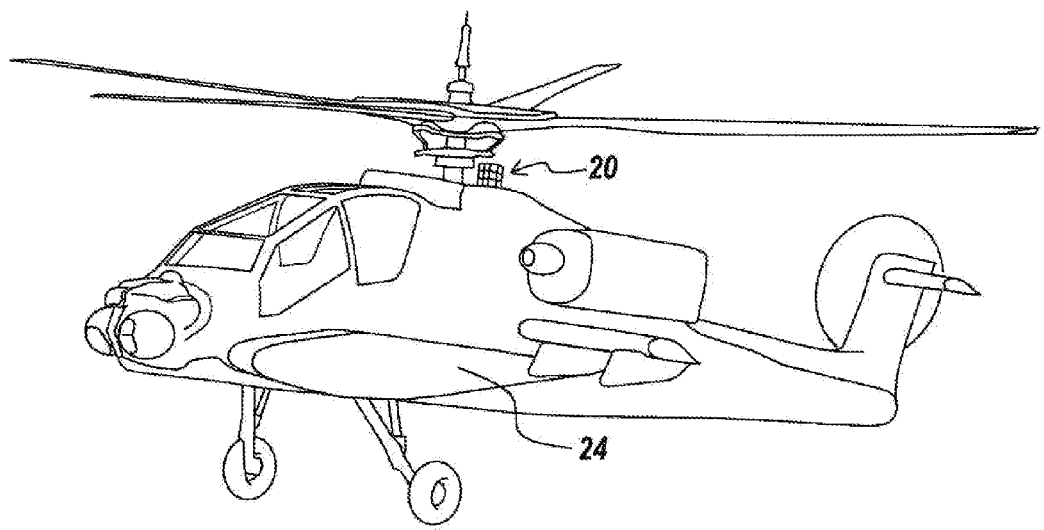
FIG. 4 is a diagrammatic illustration of the utilization of the module of FIG. 3 aboard a helicopter to provide enough IR jamming radiation to mask the heat signature produced by the helicopter.

As shown in FIG. 3, a module 20 comprised of the IR source, housing, masks and lenses of FIGS. 1 and 2 is shown, with module 20 being secured to a base 22 readily mountable as illustrated in FIG. 4 on an aircraft 24, in this case a helicopter. Here the radiation emitted from module 20 is of sufficient power to mask out the thermal signature of the aircraft by providing modulated infrared radiation which when detected by a missile seeker causes the missile seeker to think that the aircraft is other than where it actually is. This countermeasure causes the missile to go off course and miss the aircraft.

The modules of FIGS. 1 through 4 correspond to conventional staring systems such as the AN/ALQ-144 system, with the expense and physical complexity of these modules adding to cost and maintenance problems.

Figure 5:
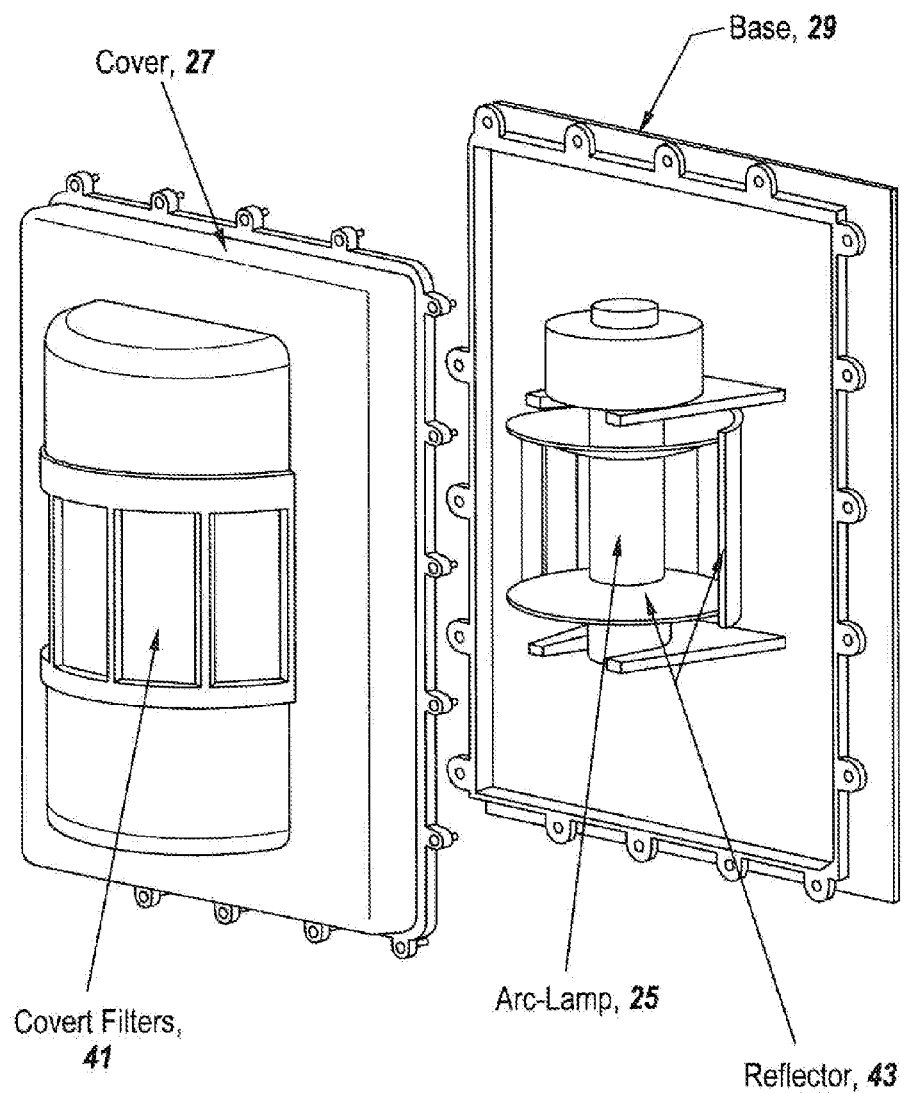
FIG. 5 is a diagrammatic illustration of the ALQ-157 arc-lamp based system with base and cover open to show the replaceable lamp.
Figure 6:
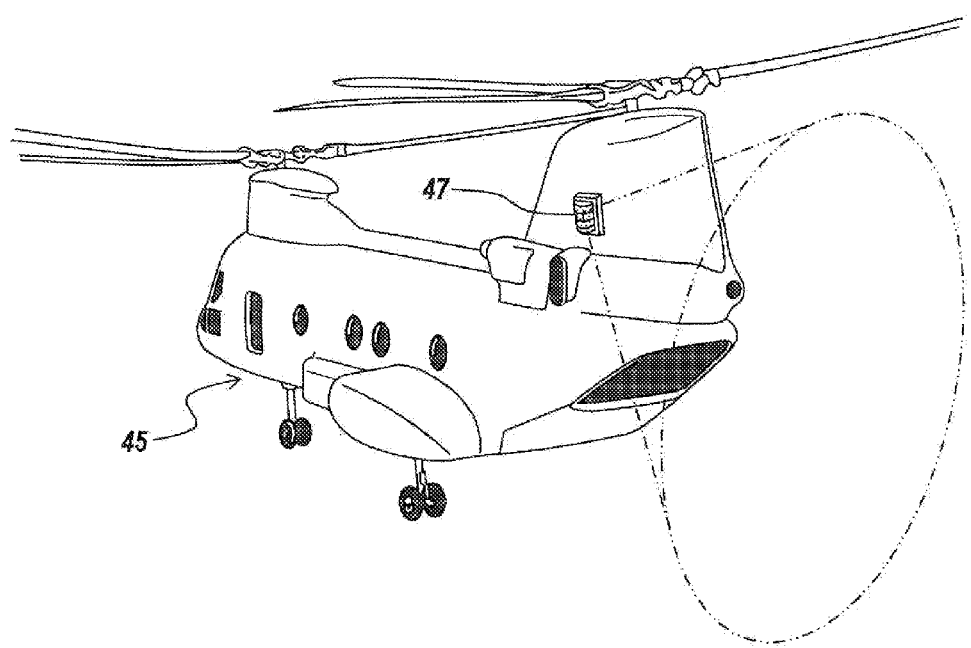
FIG. 6 is a diagrammatic illustration of the ALQ-157 of FIG. 5 mounted to a helicopter.

Unlike the AN/ALQ-44, the AN/ALQ-157 of FIG. 5 provides jam modulation by electrically modulating an arc-lamp 25. FIG. 5 depicts an AN/ALQ-157 with the cover 27 off and a base 29 securing the replaceable arc-lamp 25. Cover filters 41 prevent unwanted (visible light) spectral responses, and reflectors 43 reflect energy in desired configuration depending on signature of the protected platform. FIG. 6 illustrates a CH-46 U.S. Navy helicopter 45 with the AN/ALQ-157 module 47 of FIG. 5 installed.

Figure 7:
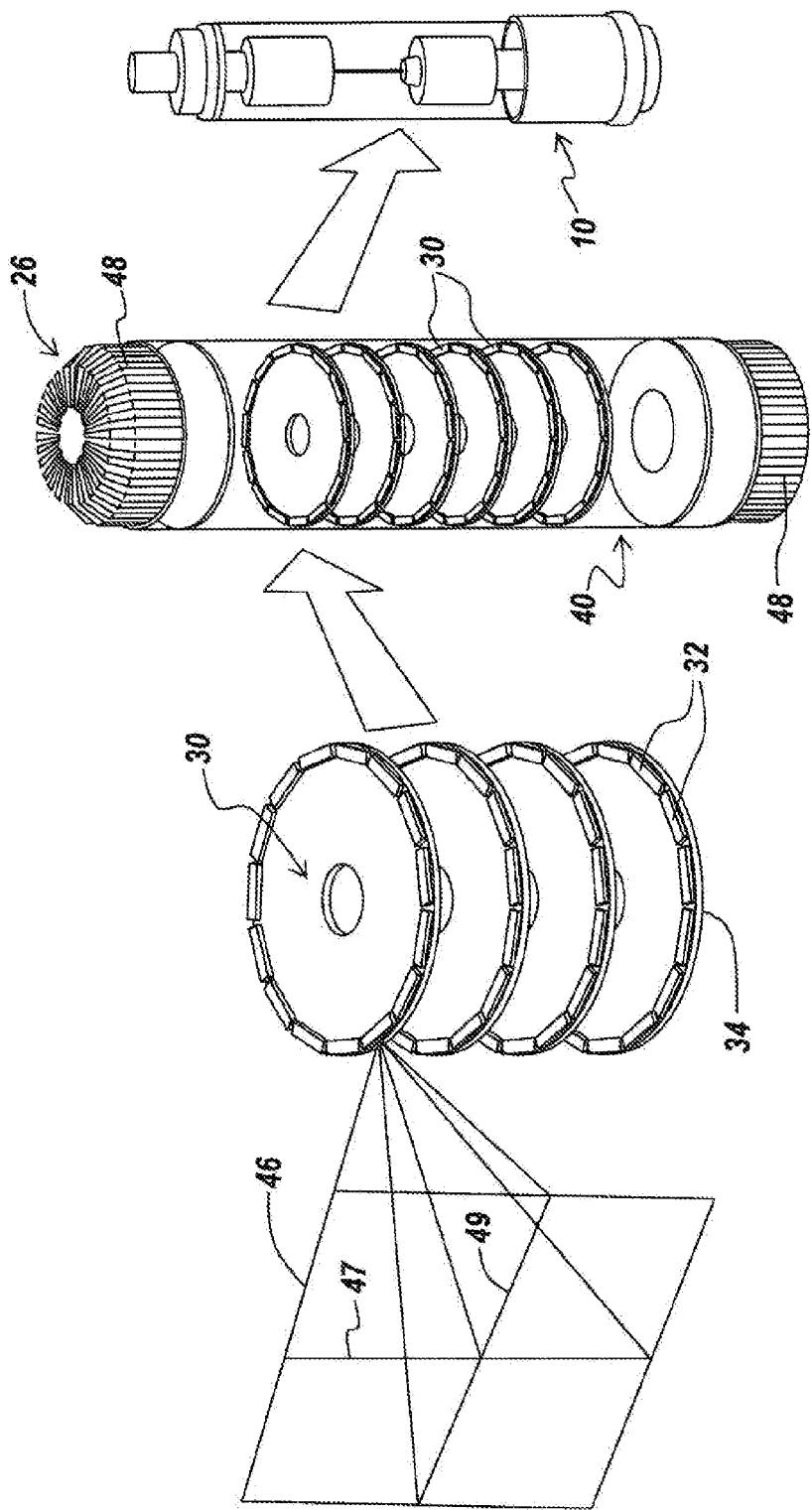
FIG. 7 is a diagrammatic illustration of the use of multiple single emitter diode laser bars arranged around the peripheries of multiple stacked rings or disks carried in an evacuated housing that are used as to provide a replacement for the traditional fixed IR source.

Referring to FIG. 7, fixed IR source 10 in one embodiment, a cesium-arc lamp, is replaced by a semiconductor infrared laser lamp 26 made up of disks or rings 30 carrying multiple laser diode bars 32, each having a number of single emitter laser diodes. The rings carrying the laser diode bars are stacked in an IR transparent lamp housing 40 having end cap heat exchangers 48. As will be discussed in connection with FIG. 9, the laser diode bars are capable of tens-of-watts each, and when stacked as illustrated, provide more than sufficient modulated infrared energy to counter a wide class of incoming missiles. As will be discussed, the field of view 46 of each of the individual single emitters shows that each individual emitter has a vertical component 47 and a horizontal component 49. Because the laser diode bars are arranged around the periphery 34 of the disk, lamp 26 has a 360° staring field of view in the horizontal direction.

Figure 8:
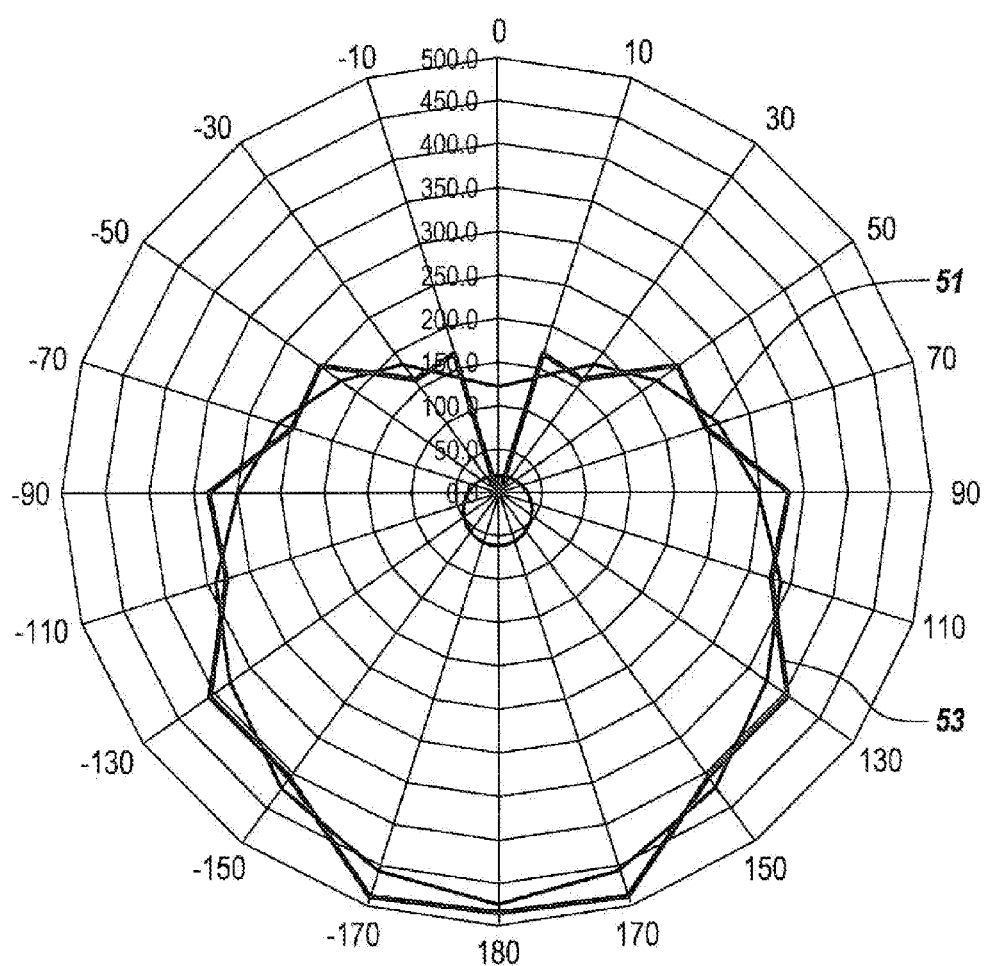
FIG. 8 is a diagrammatic illustration of laser distribution for effective coverage to mask platform signature.

The amount of energy and the energy pattern can be tailored to provide protection where needed as illustrated in FIG. 8. The signature of an aircraft is not generally equally distributed but often follows a pattern such as that illustrated at 51. The amount of energy of energy emitted by the semiconductor IR lamp can be tailored spatially as illustrated at 53 to emulate the unique signature of each platform being protected. This allows conservation of aircraft power.

Figure 9:
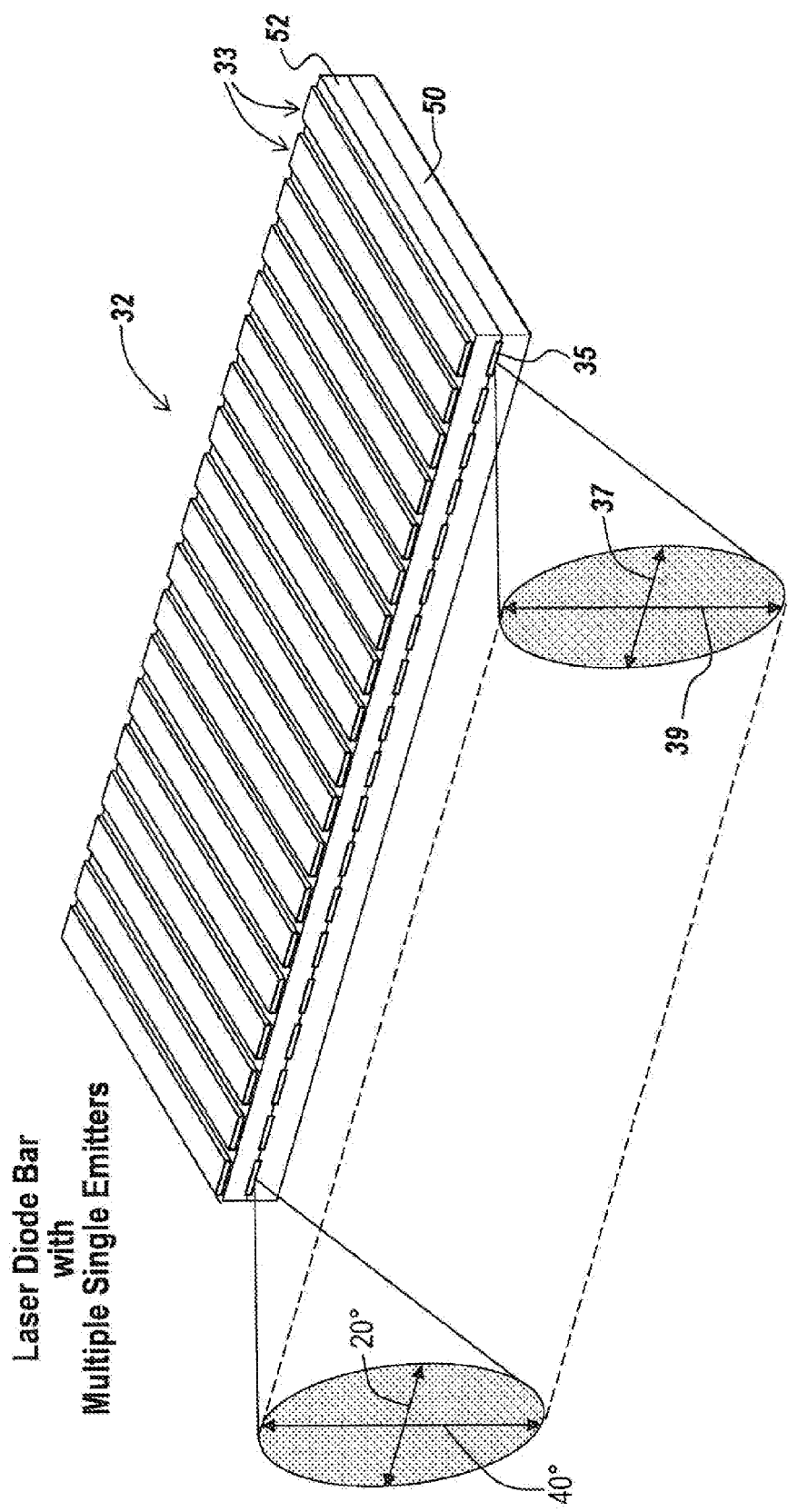
FIG. 9 is a diagrammatic illustration of a laser diode bar for use in the semiconductor 1R lamp of FIG. 7, with the angles depicted being typical and variable depending on construction of the semiconductor materials.

Referring now to FIG. 9, and as will be discussed hereinafter, laser diode bars 32 are available and include individual laser diodes 33, each having a P-type material 50 and an N-type material 52, such that there is a laser emission from the junction between the two as illustrated at 35 in which the horizontal field of view 37, in one embodiment is 12°, whereas the vertical field of view illustrated at 49 is 40°. These angles are typical but will vary depending on the construction of the wafer during fabrication.

These diode laser bars are derived from the technology used in laser welders and in one embodiment up to thirty single emitters can be located in a laser diode bar.

As will therefore be appreciated, semiconductor lasers from the laser-welding field which are capable of massive amounts of energy are packaged so as to provide a 360° staring coverage, with each bar having a sufficiently powerful output to effectively countermeasure incoming threats.

Figure 10:
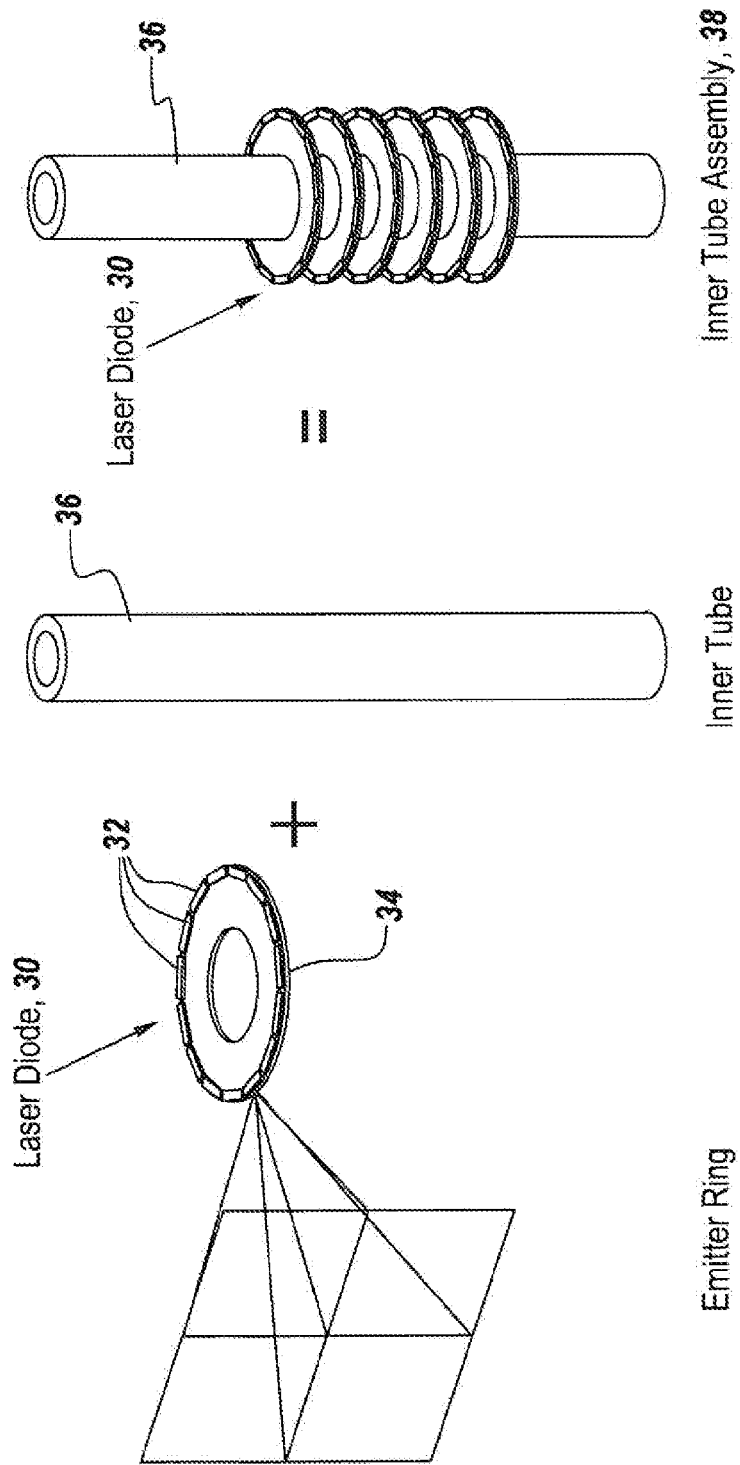
FIG. 10 is a diagrammatic illustration of the subject replacement assembly showing the utilization of diode rings stacked about an inner tube to provide a stacked ring assembly.

More particularly, referring to FIG. 10, a semiconductor laser diode IR lamp replaces the lamps in the modules of FIGS. 1-4. This IR source includes a laser diode ring or disk 30 having multiple laser diode bars 32 spaced about the periphery 34 of the disk. The disk is centrally apertured to provide a ring having a central aperture for the passage of an inner tube 36 there through, which is provided with an air stream or cooling material. It is the purpose of the subject invention that this semiconductor IR laser source can be substituted for the heating rod of FIGS. 1 through 4 and the arc-lamp 25 of FIG. 5. Note, this IR source includes an inner tube assembly 38 on which the laser diode rings 30 are stacked as illustrated about inner tube 36.

Figure 11:
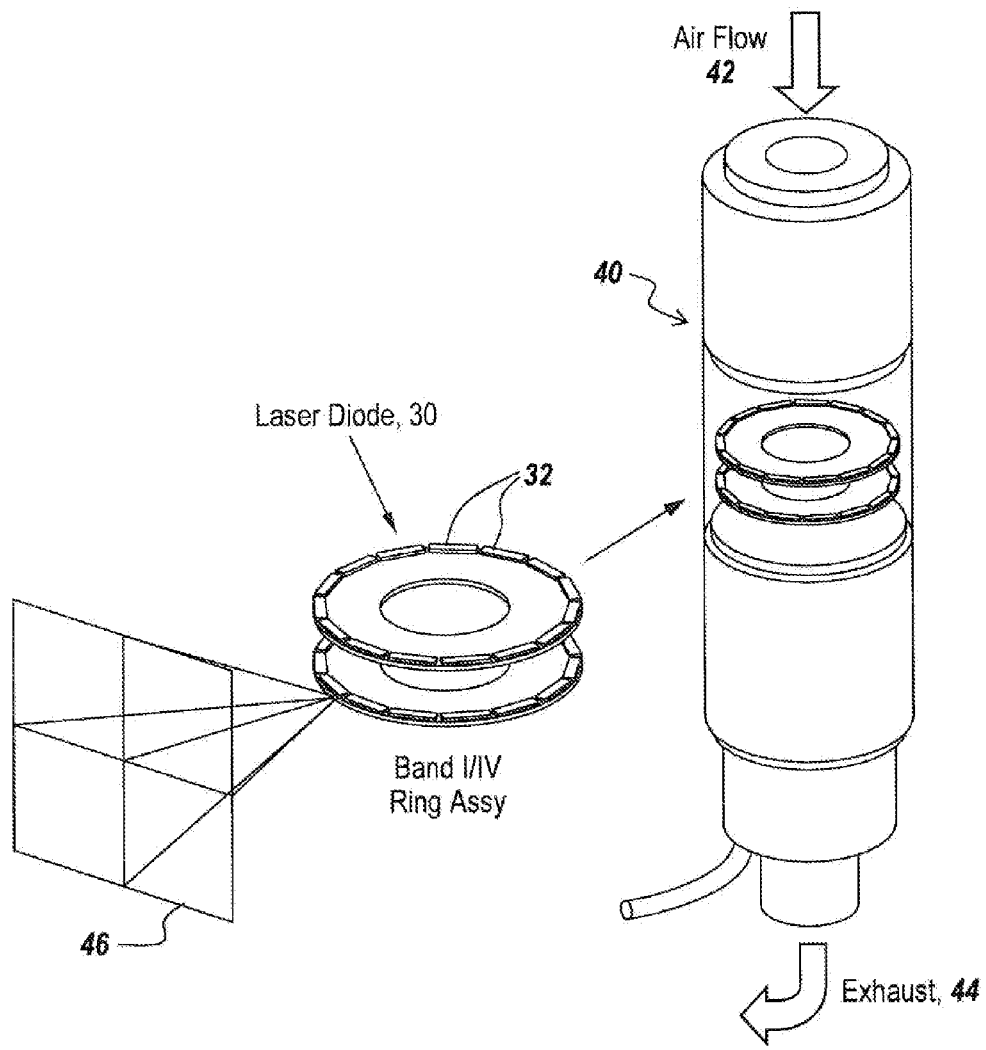
FIG. 11 is a diagrammatic illustration of a semiconductor infrared diode laser source that can be substituted for the traditional heated tube or arc-lamp sources in a jamming module, in which Band I/IV ring assemblies are assembled about the inner tube of FIG. 10 into a housing through which airflow or cooling materials are introduced.

Referring to FIG. 11, as can be seen, laser diode rings 30 can be stacked and can be provided with modulated outputs in Band I, Band II and Band IV. In one embodiment these rings are stacked on an inner tube assembly contained within a transparent housing 40 which in one embodiment is evacuated, and through which an airflow 42 runs centrally and exhausts as illustrated at 44.

The field of view of this IR source is illustrated at 46 for each of the single emitter laser diodes within each of the bars 32 located about the periphery of the laser diode rings.

Figure 12:
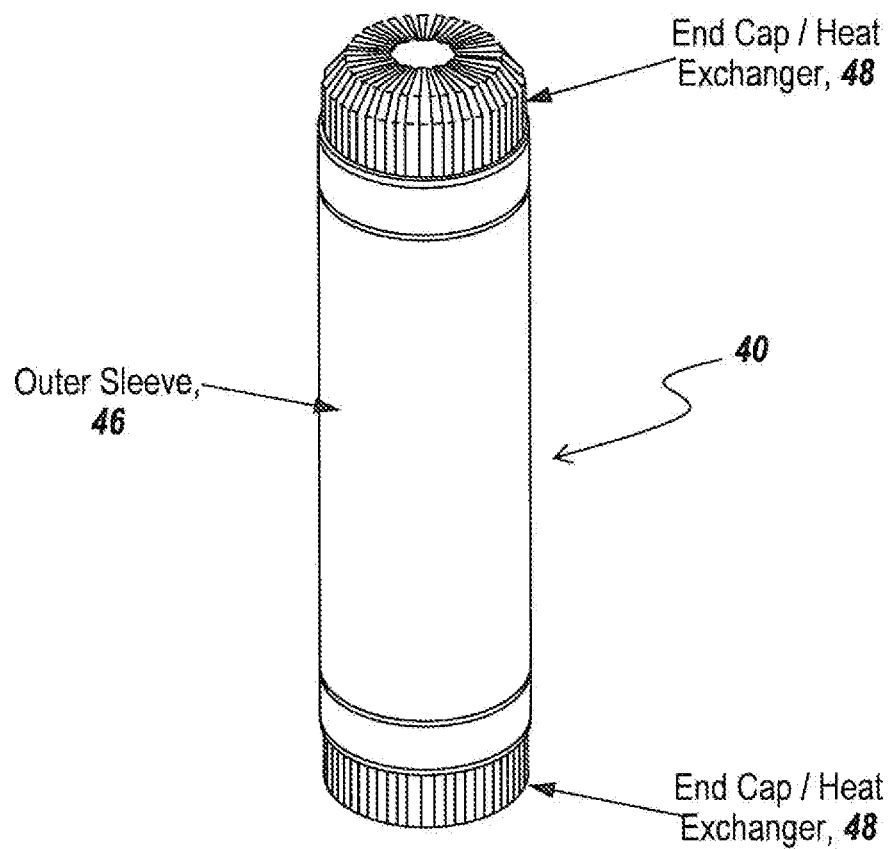
FIG. 12 is a diagrammatic illustration of the completed semiconductor laser diode IR source in which the stacked rings of FIG. 10 are housed within an outer sleeve capped with end cap heat exchangers at either end and apertured in the center to provide for the introduction and exhaust of air.

Referring to FIG. 12, housing 40 includes an IR transparent outer sleeve 46, with the outer sleeve capped by end cap heat exchangers 48 to provide the final semiconductor IR lamp of the subject invention.

Figure 13:
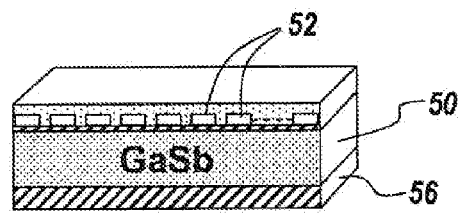
FIG. 13 is a diagrammatic illustration of a gallium antimony semiconductor laser device.

Referring now to FIG. 13, each of the semiconductor laser diode bars are shown to include a gallium antimony layer 50 constituting a P-type material on which are patterned N-type materials 52 as illustrated. It is noted that the gallium antimony P-type layer is located on a heat-sink cathode 56.

Figure 14:
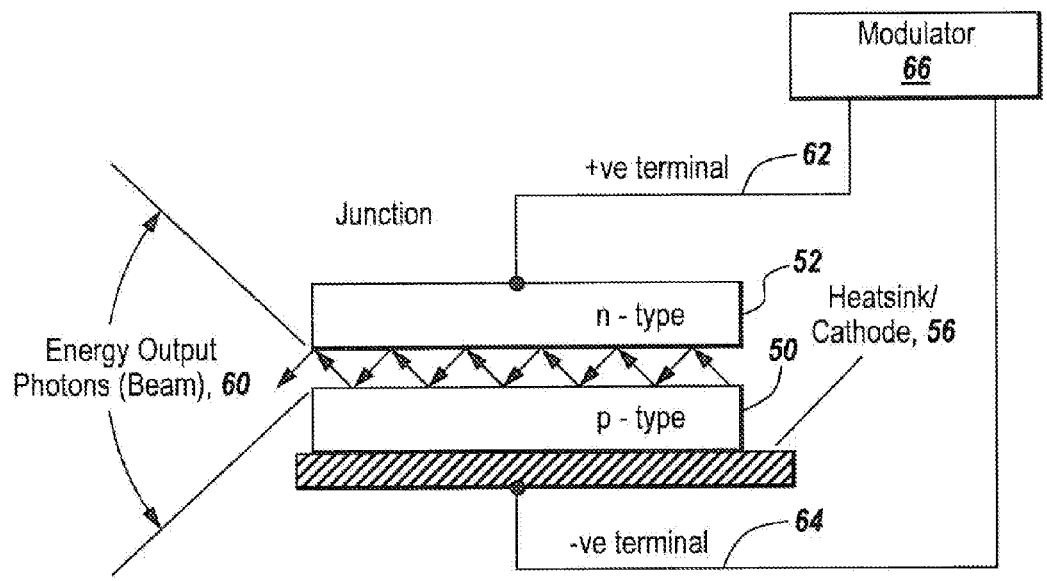
FIG. 14 is a diagrammatic illustration of the gallium antimony semiconductor device of FIG. 13 showing the utilization of a P-type and N-type material mounted on a heat-sink cathode in which the junction between the N-type and P-type devices produces a laser beam in terms of photon beams.
Figure 15:
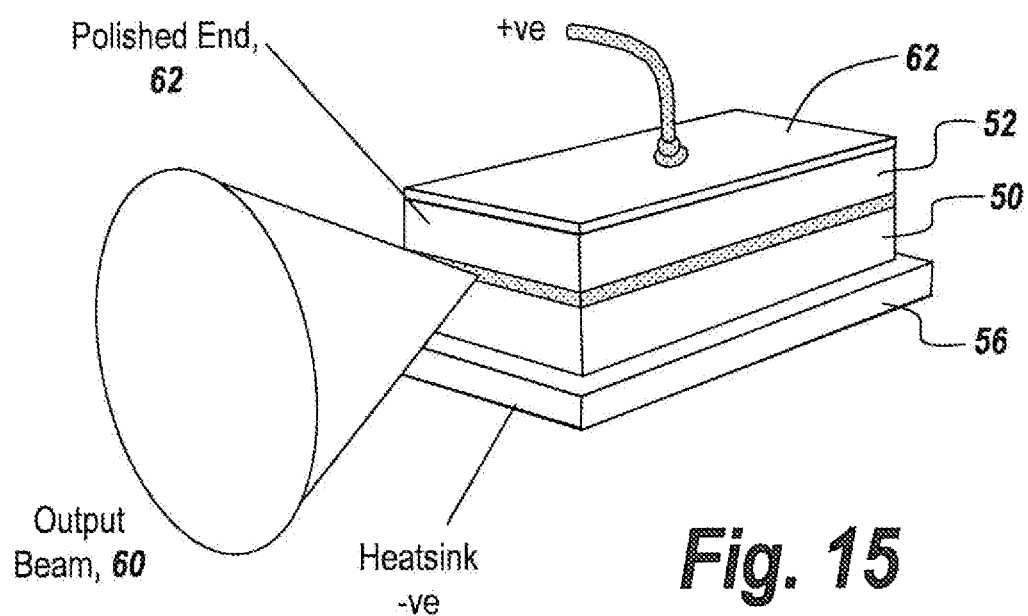
FIG. 15 is a diagrammatic illustration of the completed single emitter semiconductor laser of FIG. 14, illustrating in perspective view a polished end of the single emitter to couple out the laser beam.

Referring to FIGS. 14 and 15, junction of P-type layer 50 and N-type layer 52 provides a channel from which photons exit as photon beam 60. It is noted that biasing for the single emitter semiconductor laser diodes is provided by a +ve terminal 62 and a −ve terminal 64, with the −ve terminal 64 in one embodiment being the aforementioned heat-sink cathode 56. Note the voltages +ve and −ve can be modulated by a modulator 66 to provide an appropriately coded output beam 60. Thus in terms of FIG. 15, what can be seen is that a single emitter laser diode includes the ve terminal 62, the N-type material 52, the P type material 50 and the heat-sink cathode 56, with output beam 60 being projected from a polished end 62 of the single emitter structure.

Figure 16A:
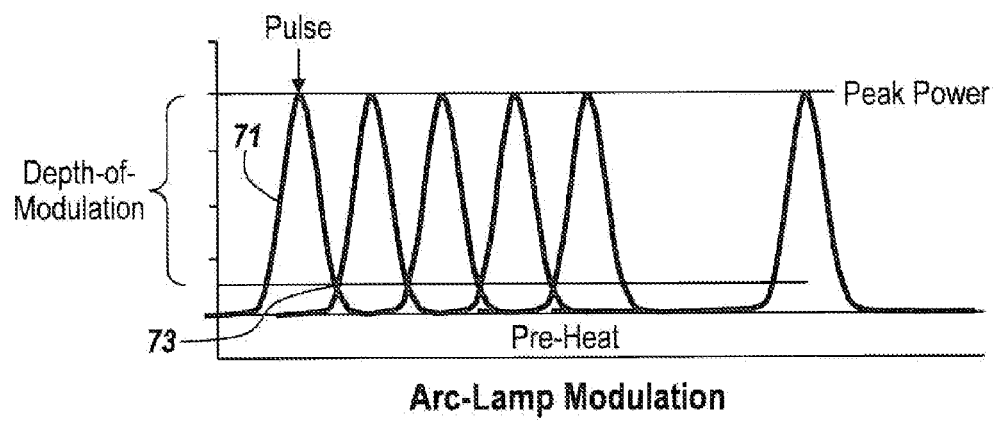
FIGS. 16A and 16B are diagrammatic illustrations of a modulation comparison of arc-lamps vs semiconductor IR lamps.
Figure 16B:
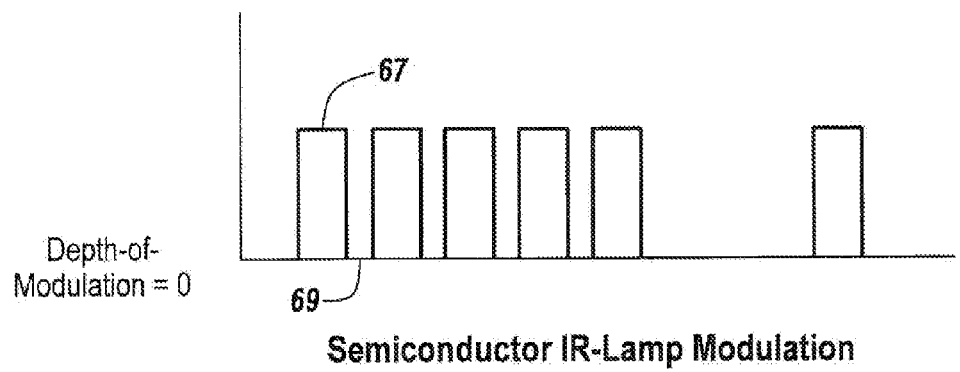

As can be seen in the modulation comparisons of FIGS. 16A and 16B, the semiconductor IR-lamp beam of FIG. 16B, is completely off at 69 when no voltage is applied, making the depth-of-modulation 67 turn completely off. This is unlike the arc-lamp modulation 71 of FIG. 16A that has residual heat and never turns completely off as illustrated at 73 due to a self signature.

Figure 17:
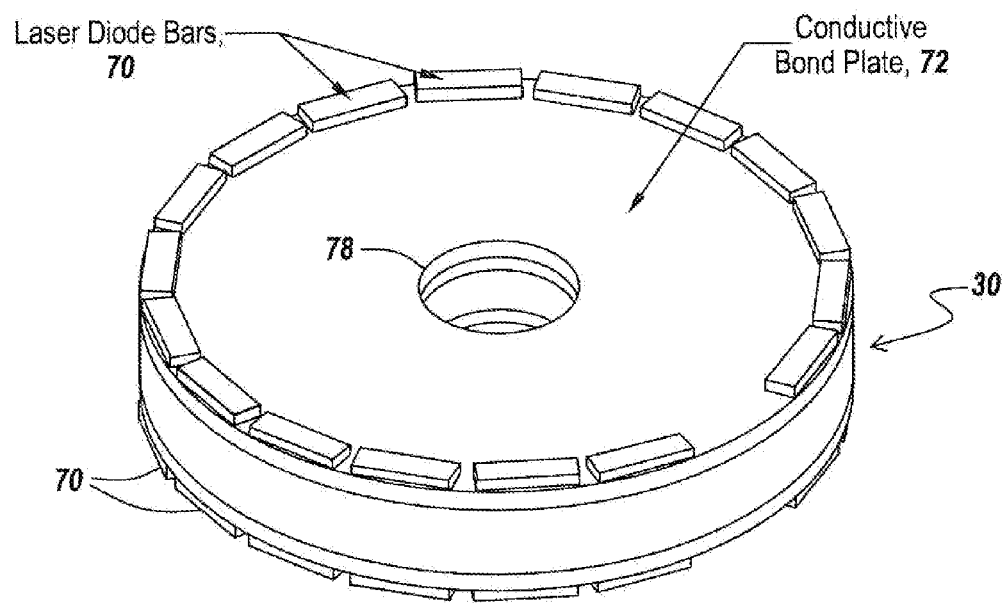
FIG. 17 is a diagrammatic illustration of multiple laser diode bars around the periphery of a ring, in which the laser diode bars are arranged on both the top and bottom surfaces of the ring.

Laser diode bars constructed with multiple single emitter laser diodes are illustrated in FIG. 17 to be bonded to a circular conductive bond plate 72, with the laser diode bars 70 positioned on either side of ring 30.

Figure 18:
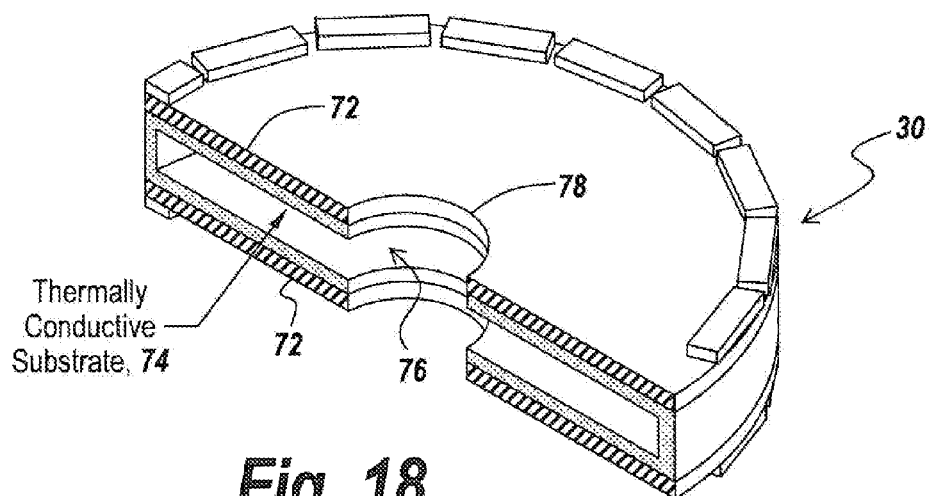
FIG. 18 is a diagrammatic and cross sectional view of the assembly of FIG. 17 illustrating the utilization of a thermally conductive substrate for the top and bottom portions of the ring, also illustrating a chamber between the thermally conductive substrates.

As can be seen in FIG. 18, conductive plates 72 are positioned on a hollow thermally conductive substrate 74 that provides a chamber 76 between the top and bottom conductive plates. This structure along with central aperture 78 in the disk assembly provides for a centrally-located cooling chamber for each of the rings as well as to provide for passage of airflow through the disks for cooling purposes.

Figure 19:
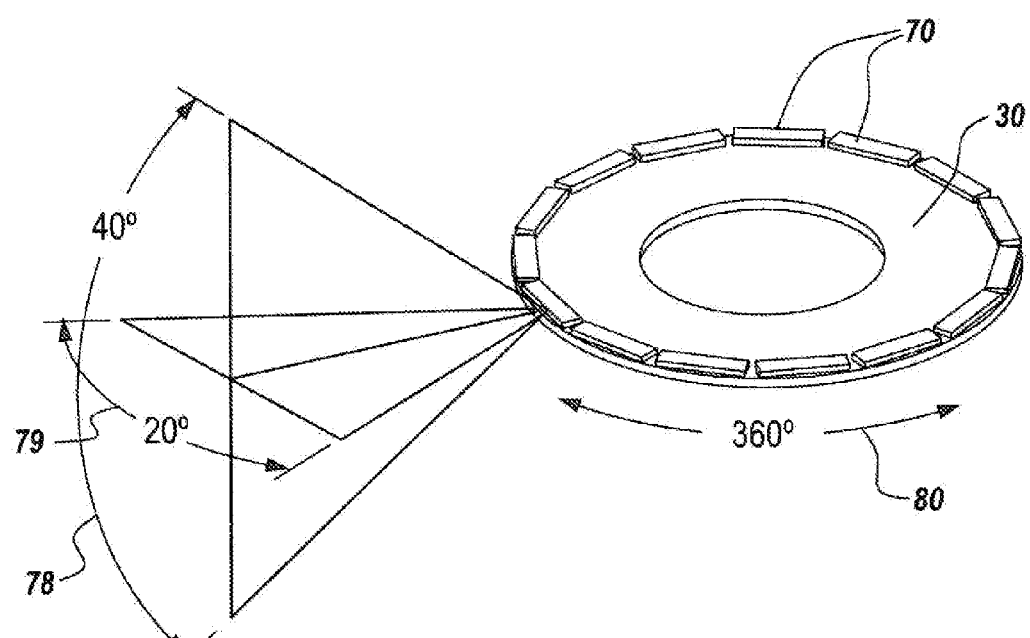
FIG. 19 is a diagrammatic illustration of the output of the multi-element laser diode bars of FIGS. 17 and 18, illustrating that for each individual element there is an approximate 40° vertical field of view and an approximate lateral 12° field of view for each of the laser diode elements; and, FIG. 20 is an embodiment of a subject invention in which selected rings on which the laser diode elements are located are dish-shaped such that the laser diode bars located at the periphery of these dish-shaped elements point in different directions, the composite providing an up to 160° field of view for the module.

As can be seen in FIG. 19 with the diode bars 70 mounted to rings 30, the staring field of view for each of the individual or single element diode lasers is about 40° in the vertical direction and about 12° in the horizontal direction.

As will be appreciated, with the laser diode bars located on the periphery of a ring one achieves 360° coverage, here illustrated by double-ended arrow 80. The vertical coverage is illustrated by double-ended arrow 78 and the horizontal coverage is illustrated by double-ended arrow 79.

Figure 20:
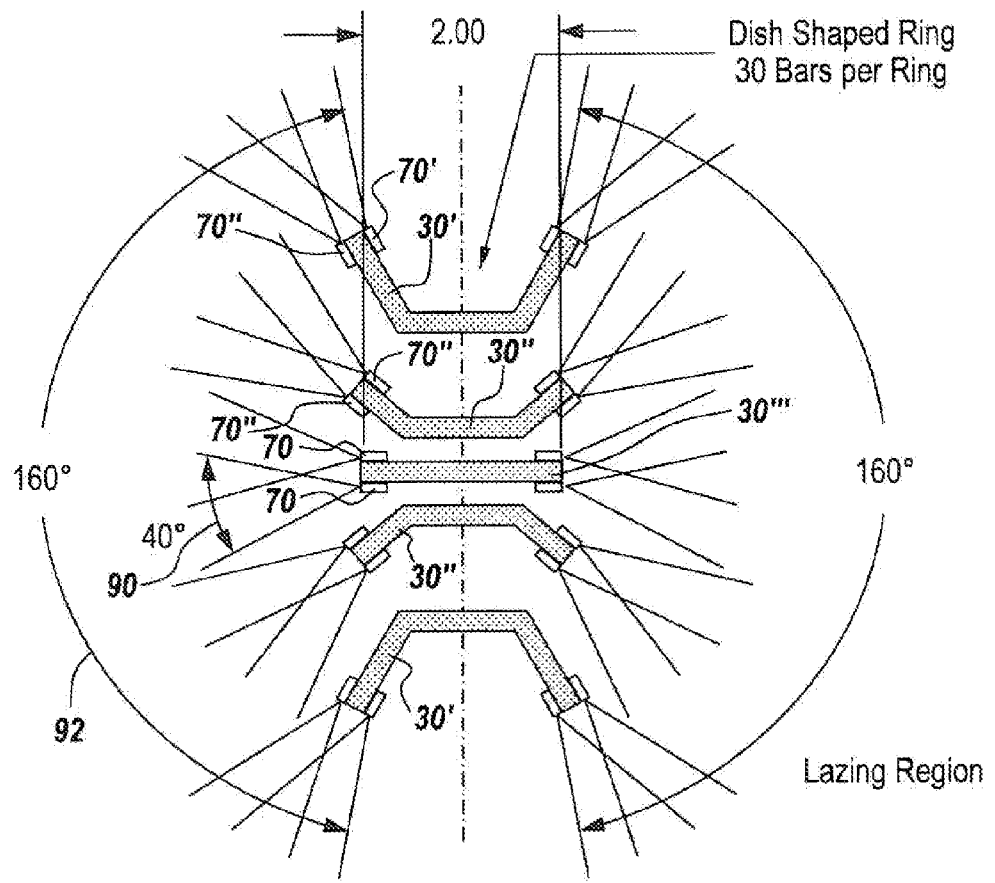

In order to extend the vertical coverage of the semiconductor IR source to a virtual sphere, as shown in FIG. 20 ring 30' and 30" are dish-shaped in which one of the rings is upwardly bowed or offset from the central flat plane of the ring to orient the associated diode bars so that they point in the indicated directions for diode bars 70' and 70". It is noted that a central flat ring 30" has the field of view described in FIG. 14.

Thus, for each of the diode bars there is a 40° vertical field of view angle as illustrated by double-ended arrow 90. When the rings are dished as illustrated, the result is a 160° field of view as illustrated by double-ended around 92.

Thus, the lasing region is virtually spherical for the subject IR source when the source is made up of a number of stacked dish-shaped elements about a flat disk element.

More specifically, the subject invention is directed to how existing IRCM lamp based systems can benefit from an integrated Band I/Band IV (even band II) lamp solution capable of protecting small to mid-size signature platforms. This idea breaks from traditional arc-lamp or heated element systems and employs semiconductor materials to provide specific IR wavelength protection against older and advanced IR missiles.

The welding industry has matured the use of semiconductor lasers, in the range of kilowatts of energy, packaged into very small form factors that provide sufficient heat to weld heavy metals.

The subject IRCM solution is provided by leveraging off of these laser technologies and techniques by taking bar-type multiple laser emitter bars and locating the emitters at the periphery of a disk to provide a 360° staring angle.

Recently, developments in Band IV materials have provided similar packaging technique opportunities as the matured laser welding devices. Demonstrated maturities of these separate wave length materials suggest that the technology is ready for a staring IRCM implementation. Combining the multiple wavelength types of semiconductor materials (laser diodes) into an IR source lamp configuration and construction provides an SIR-Lamp that emits Bands I and IV and if desired band II.

Those skilled in the art will appreciate that this invention may be used to upgrade conventional staring systems such as the AN/ALQ-144 system and the AN/ALQ-157 system, as well as maturing new systems that provides protection from the latest IR-seeking threats.

It will be appreciated that the present invention may also be employed in the upgrade of other conventional starring systems such as the AN/ALQ-157 system available from BAE Systems and the MATADOR® system available from BAE Systems in Ontario, Calif.

As is illustrated, the AN/AN/ALQ-144 heating rod can be replaced with a series of laser rings vacuum sealed in a SIR-Lamp configuration. The rings are populated with emitters of semiconductor material bars specifically designed to emit the wavelengths and energy levels required for protection. In an AN/ALQ-144 type system, the SIR-Lamp replacement does not require a mechanical spinning device to modulate the jam code. The subject innovation thus eliminates the need for more moving parts, environmental seals, and no covert filters.

The amount of energy emitted is dependent on the number of emitters packaged. For larger platforms, additional emitters are added to create larger SIR-Lamp sources. The goal is to provide sufficient protection for aircraft already deployed with current lamp based IRCM systems.

It will be appreciated that upgrading staring IRCM systems with an SIR-Lamp based system provides the user of such systems with the following advantages:

Added protection in Band I through IV; High reliable SIR-Lamp (laser welders last for thousands of hours) Tune-up maintenance can be "built in" to assure protection, Tune-up maintenance may result in repairable business model; Drastically reduced Self Signature, "S" resulting in much better signal to noise performance; No warm-up necessary due to the SIR-Lamp; Helicopters can fly with protection as soon as the system is turned on; Jam codes are constructed by electrical waveforms and pulses and not limited by heated devices; Higher efficiency system-Lower power DC aircraft systems can now be achieved; Eliminates moving parts to create jam codes as is used in the prior art AN/ALQ-144 system; Eliminates the need for high voltage and high current as is needed in the AN/ALQ-157 system and the MATADOR® system.

The semiconductor IR lamp of the present invention may be constructed in a similar way to prior art cesium-arc lamps that are currently fabricated, for example, by BAE Systems in Ontario, Calif. The basic construction involves an outer-envelope that transmits 2-5 µm, end caps to provide sleeve-support and hermaticity, an inner cavity that provides cooling, and rings that mount the semiconductor IR emitters. The vacuum can be backfilled with an inert gas to simultaneously provide the environmental sealing and increased heat transfer efficiency. The inner construction includes a cooling cylinder with rings attached.

Note there are advantages in using a laser available from nLight which uses an advanced indium phosphide (InP) material to provide a 2.1 µm pump laser using the industry typical semiconductor stacked-bars construction. This wavelength is ideal for a Band I solution. Coupling these techniques with the recent development in antimonide materials provides solutions for Band IV and/or Band II.

This approach provides an uncooled laser that will provide a series of Band IVa, Band IVb, Band II and a Band I solution.

The key to the subject invention is a series of IR semiconductor laser material rings. Each ring carries either single emitters or bars. The rings are dish-shaped to provide angular overlap. Preliminary performance calculations for such a construction follow:

1 bar=1 cm in length, 1 bar has 19 emitters; Divergence of a single emitter is approximately 40° fast axis, 12° slow axis @ 1/e^2; Results in approximately 30 bars around the periphery to provide 360° azimuth coverage; Mounting 15 bars each side of the ring would require approximately 2" diameter.

Providing dish-shaped rings provides angular distribution with five rings providing "near-spherical" coverage.

Lab results indicate the emitters produce from 1 to 0.5 watts per emitter; 5 rings with 30 bars each and each bar has 19 emitters: 5×30×19=2,850 emitters; At 0.5 to 1.0 watts that is an estimated 1,425 watts to 2,850 watts of Band IV energy in a form factor equivalent package to the existing starring systems.

As discussed above, the semiconductor IR lamp of the present invention can provide bands IV, I and if desired band II protection for small and medium signature platforms. It has also been calculated that one single SIR-Lamp could provide power of 3,200 w/srad. It will also be appreciated that the present invention continues to provide a jam-in-tube defense and extends the life of a lamp based protection systems.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. In an infrared countermeasures system, wherein the improvement comprises a lamp in the form of a semiconductor material emitter for providing a specific infrared wavelength to provide protection against an infrared radiation guided missile, said lamp including multiple ungimballed laser diode bars arranged around a periphery of a fixed ring to provide 360° protection, each bar having at least one laser diode, said lamp including a ring and multiple ones of said bars located about the periphery of said ring, said ring including a sufficient number of said about its periphery to provide a total output of said bars exceeding 1 kilowatt.

2. The apparatus of claim 1, wherein each of said laser diodes includes a PN junction formed in gallium antimony.

3. The apparatus of claim 1, wherein said laser diode is capable of producing at least one half watt.

4. The apparatus of claim 1, wherein said laser diode includes indium phosphide.

5. The apparatus of claim 4, wherein said indium phosphide material provides a laser output beam in IR Band I.

6. The apparatus of claim 1, wherein said laser diode provides a laser output beam operable in IR Band II.

7. The apparatus of claim 1, wherein said laser diode provides a laser output beam in IR Band IV.

8. The apparatus of claim 1, wherein said laser diode provides a series of outputs operating in at least one of Band $IV_a$, Band $IV_b$, Band II and Band I.

9. The apparatus of claim 1, wherein said laser diode operates with a 40° fast axis and a 12° slow axis at 1/e^2.

10. The apparatus of claim 1, wherein each of said emitters produce at least 0.5 watts.

11. The apparatus of claim 10, wherein each of said emitters produces at least 1 watt.

12. The apparatus of claim 1, wherein each bar has at least 19 emitters formed therein.

13. The apparatus of claim 1, wherein said lamp includes multiple stacked rings, each ring having multiple bars around the periphery thereof.

14. The apparatus of claim 13, wherein said lamp includes more than three rings.

15. The apparatus of claim 1, wherein said selected rings are dish-shaped having a major plane and uplifted edges, such that the output beams emitted from the emitters embedded in said bars are emitted at an angle to the major plane of a disk.

16. The apparatus of claim 15, wherein said lamp includes at least three rings having said bars on the peripheries thereof, upper and lower rings being dish-shaped and having their edges pointing in opposite directions, thereby to provide said lamp with a wide staring field of view.

17. The apparatus of claim 16, wherein said wide staring field of view subtends an angle of at least 160°.

18. The apparatus of claim 1, wherein said laser diode emitters are modulated with a jam code for countermeasuring an incoming radiation guided missile.

19. In a staring infrared countermeasures system, wherein the improvement comprises a lamp in the form of a semiconductor material emitter for providing a specific infrared wavelength to provide protection against an infrared radiation guided missile, wherein said emitter including at least one laser diode, said laser diode operating with a 40° fast axis and a 12° slow axis at 1/e^2.

20. The apparatus of claim 19, wherein said laser diode includes a PN junction formed in gallium antimony.

21. The apparatus of claim 19, wherein said laser diode is capable of producing at least one half watt.

22. The apparatus of claim 19, wherein said laser diode includes indium phosphide.

23. The apparatus of claim 19, wherein said indium phosphide material provides a laser output beam in IR Band I.

24. The apparatus of claim 19, wherein said laser diode provides a laser output beam operable in IR Band II.

25. The apparatus of claim 19, wherein said laser diode provides a laser output beam in IR Band IV.

26. The apparatus of claim 19, wherein said laser diode provides a series of outputs operating in at least one of Band $IV_a$, Band $IV_b$, Band II and Band I.

27. The apparatus of claim 19, wherein said lamp includes a number of laser diode emitters formed into a bar.

28. The apparatus of claim 27, wherein each of said emitters produce at least 0.5 watts.

29. The apparatus of claim 27, wherein each of said emitter produces at least 1 watt.

30. The apparatus of claim 27, wherein said bars are mounted about the periphery of a ring to provide such that a 360° staring field of view.

31. The apparatus of claim 30, wherein each bar has at least 19 emitters formed therein.

32. The apparatus of claim 27, wherein said lamp includes a ring and multiple ones of said bars located about the periphery of said ring.

33. The apparatus of claim 32, wherein said ring includes a sufficient number of said bars about its periphery to provide a total output of said bars exceeding 1 kilowatt.

34. The apparatus of claim 19, wherein said lamp includes multiple stacked rings, each ring having multiple bars around the periphery thereof.

35. The apparatus of claim 34, wherein said lamp includes more than three rings.

36. The apparatus of claim 30, wherein said selected rings are dish-shaped having a major plane and uplifted edges, such that the output beams emitted from the emitters embedded in said bars are emitted at an angle to the major plane of a disk.

37. The apparatus of claim 36, wherein said lamp includes at least three rings having said bars on the peripheries thereof, upper and lower rings being dish-shaped and having their edges pointing in opposite directions, thereby to provide said lamp with a wide staring field of view.

38. The apparatus of claim 37, wherein said wide staring field of view subtends an angle of at least 160°.

39. The apparatus of claim 1, wherein said laser diode emitters are modulated with a jam code for countermeasuring an incoming radiation guided missile.

* * * * *